United States Patent
Chin et al.

(10) Patent No.: US 9,966,465 B1
(45) Date of Patent: May 8, 2018

(54) NON-VOLATILE MEMORY DEVICE

(71) Applicant: UNITED MICROELECTRONICS CORP., Hsinchu (TW)

(72) Inventors: Hock-Chun Chin, Singapore (SG); Lan-Xiang Wang, Singapore (SG); Hong Liao, Singapore (SG); Chao Jiang, Singapore (SG); Chow-Yee Lim, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days. days.

(21) Appl. No.: 15/631,529

(22) Filed: Jun. 23, 2017

(51) Int. Cl.
 H01L 29/78 (2006.01)
 H01L 29/51 (2006.01)
 H01L 29/788 (2006.01)
 H01L 29/792 (2006.01)
 H01L 29/423 (2006.01)

(52) U.S. Cl.
 CPC .. *H01L 29/78391* (2014.09); *H01L 29/42328* (2013.01); *H01L 29/42344* (2013.01); *H01L 29/516* (2013.01); *H01L 29/7883* (2013.01); *H01L 29/792* (2013.01)

(58) Field of Classification Search
 CPC ......... H01L 39/78391; H01L 29/42344; H01L 29/42328; H01L 29/7883; H01L 29/516; H01L 29/792; H01L 29/78391
 See application file for complete search history.

(56) References Cited

U.S. PATENT DOCUMENTS

| | | | |
|---|---|---|---|
| 6,642,573 B1 * | 11/2003 | Halliyal | H01L 21/28185 257/316 |
| 7,683,323 B2 * | 3/2010 | Kymissis | G01J 5/34 250/338.3 |
| 8,362,604 B2 | 1/2013 | Ionescu | |
| 8,785,995 B2 | 7/2014 | Dubourdieu et al. | |
| 9,843,007 B2 * | 12/2017 | Chang | H01L 51/0554 |
| 2004/0051126 A1 * | 3/2004 | Cuchiaro | H01L 21/28185 257/295 |
| 2016/0308070 A1 | 10/2016 | Chang et al. | |
| 2017/0141235 A1 * | 5/2017 | Lai | H01L 29/78391 |
| 2017/0178698 A1 * | 6/2017 | Van Houdt | G11C 7/06 |

OTHER PUBLICATIONS

Kung Hong Lee, Mu-Kai Tsai and Chung-Hsing Lin, "Multi-Threshold Voltage Semiconductor Device", U.S. Appl. No. 15/391,822, filed Dec. 27, 2016, United Microelectronics Corp., Hsinchu, (TW).

S. Bhattacharya, et al., "Improved Performance and Reliability of Split Gate Source-Side Injected Flash Memory Cells", ,1996, IEEE, IEDM.

(Continued)

Primary Examiner — William Coleman
(74) Attorney, Agent, or Firm — WPAT, PC

(57) ABSTRACT

A non-volatile memory device is provided. The non-volatile memory device includes a substrate, a first dielectric layer, a charge trapping layer, a ferroelectric material layer, and a gate layer. The first dielectric layer is disposed on the substrate, the charge trapping layer is disposed on the first dielectric layer, the ferroelectric material layer is disposed on the charge trapping layer, and the gate layer is disposed on the ferroelectric material layer.

13 Claims, 2 Drawing Sheets

(56) References Cited

OTHER PUBLICATIONS

K. Yoshikawa, et al., "Lucky-Hole Injection Induced by Band-To-Band Tunneling Leakage in Stacked Gate Transistors",1990, IEEE, IEDM.
K.S. Li, et al., "Sub-60mV-Swing Negative-Capacitance FinFET without Hysteresis", 2015, IEEE, IEDM.
A. Thean, "IEDM Short Course: Technology Options at the 5-Nanometer Mode" Dec. 3, 2016, San Francisco, California, USA.
S. Dasgupta et.al, "Sub-kT/q Switching in Strong Inversion in PbZr0.52Ti0.48O3 Gated Negative Capacitance FETs", 2015, vol. 1, IEEE Journal on Exploratory Solid-State Computational Devices and Circuits.
M. H. Lee et al, "Steep Slope and Near Non-Hysteresis of FETs With Antiferroelectric-Like HfZrO for Low-Power Electronics", Apr. 2015, vol. 36, No. 4, IEEE Electron Device Letters.
A. I. Khan et.al, "Negative Capacitance in Short-Channel FinFETs Externally Connected to an Epitaxial Ferroelectric Capacitor", Jan. 2016, vol. 37, No. 1, IEEE Electron Device Letters.
J. Jo and C. Shin, "Negative Capacitance Field Effect Transistor WithHysteresis-Free Sub-60-mV/Decade Switching", Mar. 2016, vol. 37, No. 3, IEEE Electron Device Letters.
Robertson J., "Band offsets of wide-band-gap oxides and implications for future electronic devices", 2000, American Vacuum Society.

\* cited by examiner

NON-VOLATILE MEMORY DEVICE

BACKGROUND

Technical Field

The present disclosure relates in general to a non-volatile memory device, and more particularly to a non-volatile memory device having a ferroelectric material layer.

Description of the Related Art

Non-volatile memory devices have been widely developed and used in the past decades. Among the various types of non-volatile memory devices, charge trap memory cells require high voltages for program and erase operations. In order to achieve high voltage applications, a large amount of researches and developments in manufacturing as well as improving the structures of such devices have been disclosed.

SUMMARY OF THE INVENTION

The present disclosure is directed to a non-volatile memory device. In the embodiments of the present disclosure, the ferroelectric material layer of the non-volatile memory device is capable of achieving negative capacitance characteristics for effectively increasing the internal voltage for program/erase of the non-volatile memory device; as such, the applied gate voltage can be effectively reduced while a high internal operational voltage capable of high-voltage operations can be realized.

According to an embodiment of the present disclosure, a non-volatile memory device is disclosed. The non-volatile memory device includes a substrate, a first dielectric layer, a charge trapping layer, a ferroelectric material layer, and a gate layer. The first dielectric layer is disposed on the substrate, the charge trapping layer is disposed on the first dielectric layer, the ferroelectric material layer is disposed on the charge trapping layer, and the gate layer is disposed on the ferroelectric material layer.

The disclosure will become apparent from the following detailed description of the preferred but non-limiting embodiments. The following description is made with reference to the accompanying drawings.

DETAILED DESCRIPTION OF THE INVENTION

Figure 1:
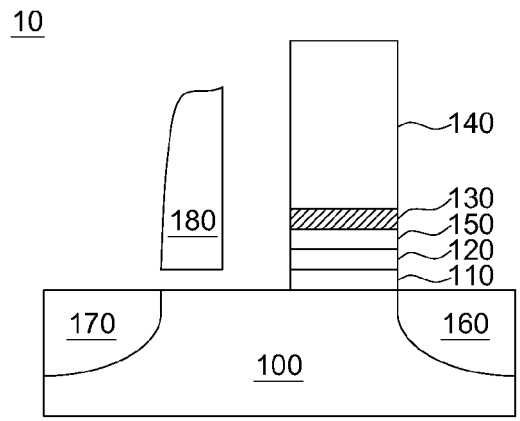
FIG. 1 is a schematic view of a non-volatile memory device according to an embodiment of the present disclosure.

According to the embodiments of the present disclosure, a non-volatile memory device is provided. In the embodiments, the ferroelectric material layer of the non-volatile memory device is capable of achieving negative capacitance characteristics for effectively increasing the internal voltage for program/erase of the non-volatile memory device; as such, the applied gate voltage can be effectively reduced while a high internal operational voltage capable of high-voltage operations can be realized.

The embodiments are described in details with reference to the accompanying drawings. The procedures and details of the structures of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regarded as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

FIG. 1 is a schematic view of a non-volatile memory device according to an embodiment of the present disclosure. As shown in FIG. 1, the non-volatile memory device 10 includes a substrate 100, a first dielectric layer 110, a charge trapping layer 120, a ferroelectric material layer 130, and a gate layer 140. The first dielectric layer 110 is disposed on the substrate 100, the charge trapping layer 120 is disposed on the first dielectric layer 110, the ferroelectric material layer 130 is disposed on the charge trapping layer 120, and the gate layer 140 is disposed on the ferroelectric material layer 130.

According to the embodiments of the present disclosure, the ferroelectric material layer 130 is capable of achieving negative capacitance characteristics for effectively increasing the internal voltage for program/erase of the non-volatile memory device. As such, the applied gate voltage can be effectively reduced while a high internal operational voltage capable of high-voltage operations can be realized.

In the embodiments, the first dielectric layer 110 may be formed of a high-k dielectric material. In the embodiments, the first dielectric layer 110 may include a silicon oxide layer, a silicon oxynitride layer, or a combination thereof.

In the embodiments, the ferroelectric material layer 130 may include hafnium zirconium oxide (HZO), lead zirconate titanate (PZT), $BiFeO_3$, PVDF-TrFE, or any combination thereof, and the above materials are all CMOS compatible, which is advantageous to incorporating the ferroelectric material layer 130 into the non-volatile memory device without increasing the complexity of the existing manufacturing process.

In the embodiments, the gate layer 140 may include any suitable gate electrode material, such as polysilicon, Ta, TaN, Nb, Al, or any combination thereof.

In the embodiments, as shown in FIG. 1, the non-volatile memory device 10 may further include a source line region 160 and a bit line region 170. The source line region 160 and the bit line region 170 are formed in the substrate 100 and respectively located on two lateral sides of the gate layer 140.

In some embodiments of the present disclosure, the charge trapping layer 120 may include a silicon nitride layer.

In the embodiments, as shown in FIG. 1, the non-volatile memory device 10 may further include a second dielectric layer 150, and the second dielectric layer 150 is disposed between the gate layer 140 and the charge trapping layer 120.

In some embodiments, the first dielectric layer 110 and the second dielectric layer 150 may be respectively and independently a silicon oxide layer, a silicon oxynitride layer, or a combination thereof. In some embodiments, the first dielectric layer 110, the charge trapping layer 120 and the second dielectric layer 150 form an oxide-nitride-oxide (ONO) stack.

In some embodiments, the non-volatile memory device 10 may further include a select gate 180 disposed on the substrate 100. The select gate 180 is electrically isolated from the gate layer 140 by an insulator (now shown in drawings), and the insulator includes such as silicon oxide, silicon nitride, or a combination thereof. The select gate 180 provides additional control to the non-volatile memory device 10; for example, the select gate 180 controls the channel of the non-volatile memory device 10.

In the embodiment as shown in FIG. 1, the ferroelectric material layer 130 is disposed between the gate layer 140 and the second dielectric layer 150. In other words, in the non-volatile memory device 10 as shown in FIG. 1, the ferroelectric material layer 130 is disposed between the gate layer 140 and the ONO stack (the first dielectric layer 110/the charge trapping layer 120/the second dielectric layer 150).

Figure 2:
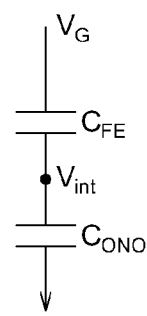
FIG. 2 illustrates a circuit diagram of the first dielectric layer, the charge trapping layer, the ferroelectric material layer, the gate layer, and the second dielectric layer of the non-volatile memory device in FIG. 1.

FIG. 2 illustrates a circuit diagram of the first dielectric layer 110, the charge trapping layer 120, the ferroelectric material layer 130, the gate layer 140, and the second dielectric layer 150 of the non-volatile memory device in FIG. 1. In FIG. 2, $V_G$ indicates the voltage applied on the gate layer 140, $V_{int}$ indicates the internal voltage, $C_{FE}$ indicates the capacitance of the ferroelectric material layer 130, and $C_{ONO}$ indicates the capacitance of the ONO stack formed from the first dielectric layer 110, the charge trapping layer 120 and the second dielectric layer 150. The internal voltage $V_{int}$ of a non-volatile memory device of the present disclosure can be represented as formula I:

$$V_{int} = \frac{C_{FE}}{C_{FE} + C_{ONO}} V_G; \qquad (I)$$

whereas $C_{FE}$ has a negative value and $C_{ONO}$ has a positive value, and the voltage gain defined as $C_{FE}/(C_{FE}+C_{ONO})$ is larger than 1. In one embodiment, when $|C_{FE}| \approx C_{ONO}$, then $C_{FE}/(C_{FE}+C_{ONO}) \gg 1$ and $V_{int} \gg V_G$.

Further examples are provided in the followings for illustrating the present disclosure. In table 1, the results of electrical characteristics of structures of example 1 and comparative example 1 are shown. The structure of example 1 includes the ferroelectric material layer 130, the gate layer 140, and the ONO stack formed from the first dielectric layer 110, the charge trapping layer 120 and the second dielectric layer 150 as shown in FIG. 1, the ferroelectric material layer 130 is formed of PZT, the first dielectric layer 110 and the second dielectric layer 150 are silicon oxides, and the charge trapping layer 120 is silicon nitride. The structure of comparative example 1 includes an ONO stack and a gate formed on the ONO stack without any ferroelectric material layer. The program operation is performed by channel hot electron (CHI) injection, and the erase operation is performed by band-to-band hot hole injection (BTBHHI).

TABLE 1

|  | Example 1 | Comparative example 1 |
| --- | --- | --- |
| $V_G$ | 2.5 V | 10 V (for program)/−7 V (for erase) |
| $V_{int}$ | 11.5 V | N/A |
| Voltage gain | 460% | N/A |

As shown in table 1, disposing the ferroelectric material layer in the non-volatile memory device can induce voltage amplification for reducing the applied gate voltage. For example, the structure of example 1 can achieve a very low applied gate voltage $V_G$ of 2.5V and obtain the effects of an internal operational voltage of 11.5V which is capable of high-voltage device operations for program or erase.

In addition, while such a high internal voltage can be created, high-voltage devices and manufacturing processes of high-voltage devices can thus be removed/omitted. For example, high-voltage P well(s), high-voltage N well(s), and high-voltage gate(s) and the manufacturing processes thereof can be removed/omitted. As such, about 20% of the area originally occupied by high-voltage components is reduced after the high-voltage components are removed, and costs are further reduced after skipping the processes for high-voltage components.

Figure 3:
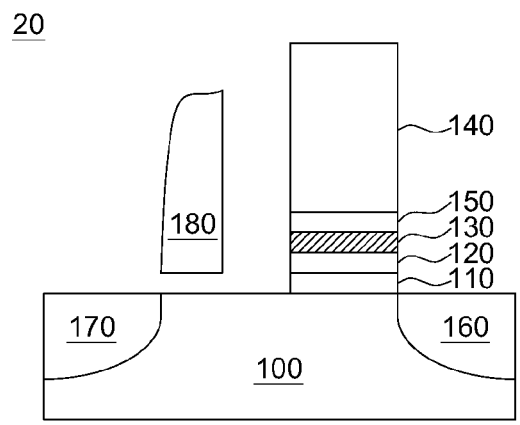
FIG. 3 is a schematic view of a non-volatile memory device according to another embodiment of the present disclosure.

FIG. 3 is a schematic view of a non-volatile memory device 20 according to another embodiment of the present disclosure. The elements in the present embodiment sharing similar or the same labels with those in the previous embodiment are similar or the same elements, and the description of which is omitted.

In the embodiment as shown in FIG. 3, the ferroelectric material layer 130 is disposed between the charge trapping layer 120 and the second dielectric layer 150. Similar to the embodiment as shown in FIG. 1, the above-mentioned formula I applies on the non-volatile memory device 20 as well, and the effects of reducing the applied gate voltage $V_G$ while increasing the internal voltage $V_{int}$ can be obtained.

Figure 4A:
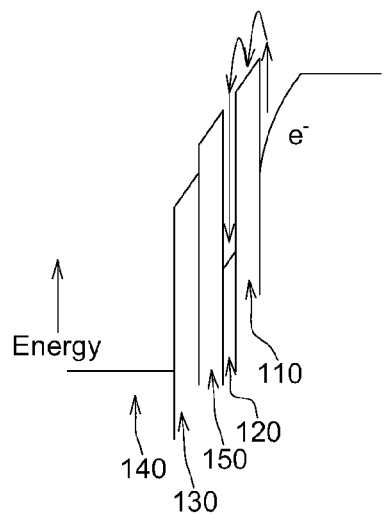
FIG. 4A shows an energy diagram of a non-volatile memory device according to an embodiment of the present disclosure.
Figure 4B:
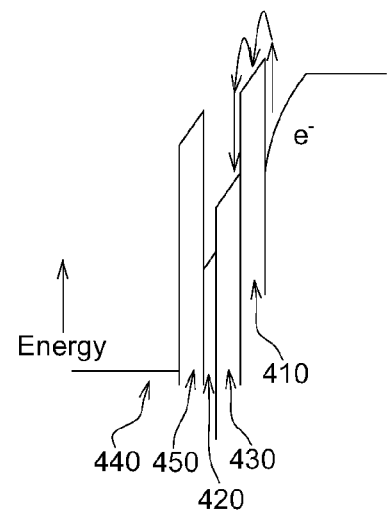
FIG. 4B shows an energy diagram of a memory device of a comparative embodiment.

FIG. 4A shows an energy diagram of a non-volatile memory device according to an embodiment of the present disclosure, and FIG. 4B shows an energy diagram of a memory device of a comparative embodiment. The non-volatile memory device for FIG. 4A includes the ferroelectric material layer 130, the gate layer 140, and the ONO stack formed from the first dielectric layer 110, the charge trapping layer 120 and the second dielectric layer 150 as shown in FIG. 1. The memory device for FIG. 4B includes an ONO stack formed from a bottom oxide 410, a nitride 420 and a top oxide 450, a ferroelectric material layer 430 formed between the nitride 420 and the bottom oxide 410, and a gate 440 formed on the top oxide 450 of the ONO stack. The program operation is performed by channel hot electron (CHI) injection.

As shown in FIG. 4B, when the program operation is performed, electrons e⁻ pass through the bottom oxide 410, the ferroelectric material layer 430, and the nitride 420, and thus there is a great chance for electrons/holes to be trapped in the ferroelectric material layer 430 and interfaces between the ferroelectric material layer 30 and adjacent layers. As such, the device performance is easily affected, and the reliability of the memory device is relatively poor.

In contrast, according to the embodiments of the present disclosure, as shown in FIG. 4A, when the program operation is performed, electrons e⁻ pass through the first dielectric layer 110, the charge trapping layer 120, and the second dielectric layer 150 without passing through the ferroelectric material layer 130. Thus, the device performance is not affected by electrons/holes trapped in the ferroelectric material layer 130 or interfaces between the ferroelectric material layer 130 and an adjacent layer. As such, the reliability of the non-volatile memory device is excellent, particularly under operations of program/erase cycling.

Figure 5:
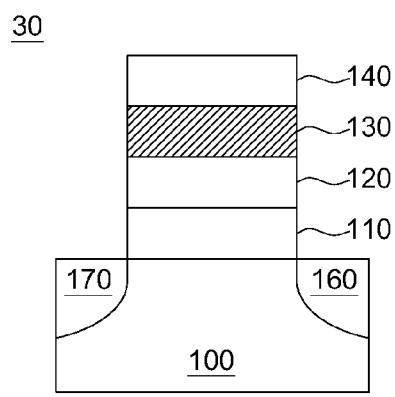
FIG. 5 is a schematic view of a non-volatile memory device according to a further embodiment of the present disclosure.

FIG. 5 is a schematic view of a non-volatile memory device according to a further embodiment of the present disclosure. The elements in the present embodiment sharing similar or the same labels with those in the previous embodiment are similar or the same elements, and the description of which is omitted.

As shown in FIG. 5, in the embodiment, the non-volatile memory device 30 may be a flash memory device, the charge trapping layer 120 is such as a floating gate layer, the first dielectric layer 110 is such as a tunneling oxide layer, and the gate layer 140 may be a control gate. In the embodiment, the charge trapping layer 120 being a floating gate layer may include a polysilicon layer.

Instead of disposing an interlayer dielectric between the control gate and the floating gate as arranged in a conventional flash memory, in contrast, the ferroelectric material layer 130 is disposed between the control gate (the gate layer 140) and the floating gate (the charge trapping layer 120), such that the ferroelectric material layer 130 is capable of achieving negative capacitance characteristics for effectively increasing the internal operational voltage for program/erase of the non-volatile memory device. As such, the applied gate voltage can be effectively reduced while a high internal operational voltage capable of high-voltage operations can be realized.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A non-volatile memory device, comprising:
   a substrate;
   a first dielectric layer disposed on the substrate, wherein the first dielectric layer comprises a silicon oxide layer, a silicon oxynitride layer, or a combination thereof;
   a charge trapping layer disposed on the first dielectric layer;
   a ferroelectric material layer disposed on the charge trapping layer; and
   a gate layer disposed on the ferroelectric material layer.

2. The non-volatile memory device according to claim 1, wherein the charge trapping layer is a floating gate layer, and the first dielectric layer is a tunneling oxide layer.

3. The non-volatile memory device according to claim 1, wherein the ferroelectric material layer comprises hafnium zirconium oxide (HZO), lead zirconate titanate (PZT), $BiFeO_3$, PVDF-TrFE, or any combination thereof.

4. The non-volatile memory device according to claim 1, wherein the charge trapping layer comprises a silicon nitride layer.

5. The non-volatile memory device according to claim 1, wherein the gate layer comprises polysilicon, Ta, TaN, Nb, Al, or any combination thereof.

6. The non-volatile memory device according to claim 1, further comprising:
   a second dielectric layer disposed between the gate layer and the charge trapping layer.

7. The non-volatile memory device according to claim 1, further comprising:
   a source line region and a bit line region formed in the substrate and respectively located on two lateral sides of the gate layer.

8. The non-volatile memory device according to claim 1, further comprising:
   a select gate disposed on the substrate, wherein the select gate is electrically isolated from the gate layer.

9. The non-volatile memory device according to claim 2, wherein the floating gate layer comprises a polysilicon layer.

10. The non-volatile memory device according to claim 6, wherein the ferroelectric material layer is disposed between the gate layer and the second dielectric layer.

11. The non-volatile memory device according to claim 6, wherein the ferroelectric material layer is disposed between the charge trapping layer and the second dielectric layer.

12. The non-volatile memory device according to claim 6, wherein the first dielectric layer and the second dielectric layer are respectively a silicon oxide layer, a silicon oxynitride layer, or a combination thereof.

13. The non-volatile memory device according to claim 6, wherein the first dielectric layer, the charge trapping layer and the second dielectric layer form an oxide-nitride-oxide stack.

* * * * *